United States Patent
Nordahl et al.

(10) Patent No.: US 10,816,026 B2
(45) Date of Patent: Oct. 27, 2020

(54) SEPARABLE PHYSICAL COUPLER USING PIEZOELECTRIC FORCES FOR DECOUPLING

(71) Applicant: Raytheon Company, Waltham, MA (US)

(72) Inventors: Christopher S. Nordahl, Chelmsford, MA (US); David G. Manzi, Tucson, AZ (US); Linda A. Gee, Danville, NH (US); Andrew B. Facciano, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 595 days.

(21) Appl. No.: 15/672,651

(22) Filed: Aug. 9, 2017

(65) Prior Publication Data
US 2019/0048914 A1    Feb. 14, 2019

(51) Int. Cl.
| | | |
|---|---|---|
| *H01L 41/09* | (2006.01) | |
| *F16B 31/00* | (2006.01) | |
| *B64G 1/64* | (2006.01) | |

(52) U.S. Cl.
CPC .............. *F16B 31/00* (2013.01); *B64G 1/645* (2013.01); *H01L 41/09* (2013.01); *F16B 2031/002* (2013.01)

(58) Field of Classification Search
CPC .... F16B 31/00; F16B 2031/002; B64G 1/645; H01L 41/083
USPC .................................................. 310/311–371
See application file for complete search history.

(56) References Cited

U.S. PATENT DOCUMENTS

| | | | | |
|---|---|---|---|---|
| 2,742,614 A | * | 4/1956 | Mason | G01H 1/10 333/147 |
| 3,229,636 A | * | 1/1966 | Mayo | F42B 15/36 102/378 |
| 3,355,703 A | * | 11/1967 | Alibert | H01R 9/05 439/581 |
| RE27,693 E | * | 7/1973 | Schafft | H03H 9/38 333/144 |
| 3,836,877 A | * | 9/1974 | Guntersdorfer | H03H 9/02228 333/187 |
| 4,703,215 A | * | 10/1987 | Asano | H02N 2/043 310/328 |
| 4,736,131 A | * | 4/1988 | Fujimoto | H02N 2/023 310/328 |

(Continued)

FOREIGN PATENT DOCUMENTS

WO    WO-02/25748 A1 *  3/2002  ............ H01L 41/04

*Primary Examiner* — Thomas M Dougherty
(74) *Attorney, Agent, or Firm* — Renner, Otto, Boisselle & Sklar, LLP

(57) ABSTRACT

A coupler for separable physically coupling together a pair of objects includes two parts, on opposite sides of a boundary, that have different piezoelectric characteristics. When an electric field is applied to the coupler parts the piezoelectric forces induce a mechanical stress that separates the parts. The parts may be made of the same or a similar material, such as a suitable ceramic material, with the different piezoelectric characteristics produced by templating the parts with different domain orientations, from different seeds, for example using a three-dimensional manufacturing processes. The coupler may be used to allow shock-free (or reduced shock) separation of parts, such as separation of stages of vehicles such as flight vehicles.

16 Claims, 2 Drawing Sheets

(56) References Cited

U.S. PATENT DOCUMENTS

| | | | | |
|---|---|---|---|---|
| 4,855,633 A * | 8/1989 | Shibuya | H02N 2/043 | 310/328 |
| 5,027,028 A * | 6/1991 | Skipper | H01L 41/083 | 310/323.02 |
| 5,796,207 A | 8/1998 | Safari et al. | | |
| 5,814,922 A * | 9/1998 | Uchino | H01L 41/107 | 310/359 |
| 5,889,354 A * | 3/1999 | Sager | F04B 17/003 | 310/330 |
| 6,384,518 B1 * | 5/2002 | van Poppel | F16D 28/00 | 310/311 |
| 6,388,634 B1 * | 5/2002 | Ramanujam | H01Q 1/288 | 343/781 P |
| 6,429,573 B2 * | 8/2002 | Koopmann | H02N 2/023 | 310/323.02 |
| 6,838,808 B2 * | 1/2005 | Tanaka | G03F 7/707 | 310/328 |
| 7,492,076 B2 * | 2/2009 | Heim | F04B 19/006 | 310/330 |
| 7,492,078 B1 * | 2/2009 | Chou | H01L 41/107 | 310/359 |
| 2004/0183406 A1 * | 9/2004 | Schuh | H01L 41/0926 | 310/330 |
| 2008/0174757 A1 * | 7/2008 | Hummel | G03F 7/70825 | 355/67 |
| 2008/0211353 A1 * | 9/2008 | Seeley | H01L 41/094 | 310/359 |
| 2010/0284098 A1 * | 11/2010 | Kuwano | H02N 2/101 | 359/824 |
| 2010/0320870 A1 * | 12/2010 | Rahman | H02N 2/043 | 310/328 |
| 2011/0291530 A1 * | 12/2011 | Koizumi | C01G 21/006 | 310/359 |
| 2014/0074062 A1 * | 3/2014 | Caffey | A61M 5/1452 | 604/506 |
| 2016/0254437 A1 * | 9/2016 | Yao | H01L 41/1136 | 310/328 |
| 2016/0329835 A1 * | 11/2016 | Koc | H02N 2/026 | |
| 2016/0347667 A1 | 12/2016 | Nordahl | | |

* cited by examiner

SEPARABLE PHYSICAL COUPLER USING PIEZOELECTRIC FORCES FOR DECOUPLING

FIELD OF THE INVENTION

The invention is in the field of systems and methods for providing separable physical couplings between parts or objects.

DESCRIPTION OF THE RELATED ART

Currently, separation for large-scale structures such as stages of a rocket vehicle is accomplished using pyrotechnics that explode to destroy the physical connection. Pyrotechnics, such as pyrotechnic fuses, can create shockwaves when they explode, which can result in damage to objects in the structures, such as payloads.

SUMMARY OF THE INVENTION

A coupler has parts with different piezoelectric characteristics.

A single-material coupler has parts with different piezoelectric characteristics.

A coupler has a ceramic material with different piezoelectric characteristics on opposite sides of a boundary. Subjecting the ceramic material to an electric field causes different piezoelectric responses, creating a mechanical stress that causes physical separation of the material at the boundary.

According to an aspect of the invention, a separable physical connector includes: a body; wherein the body has a pair of parts with different piezoelectric characteristics, with a boundary between the parts; and wherein when an electric field is applied across the body the parts separate from one another at the boundary due to the action of piezoelectric forces generated by the electric field.

According to an embodiment of any paragraph(s) of this summary, the parts both have the same material composition.

According to an embodiment of any paragraph(s) of this summary, the parts are both made of a ceramic material.

According to an embodiment of any paragraph(s) of this summary, the parts of parts of a single unitary continuous piece of material.

According to an embodiment of any paragraph(s) of this summary, at least one of the parts has an isotropic piezoelectric characteristic.

According to an embodiment of any paragraph(s) of this summary, the parts have different isotropic piezoelectric characteristics in different respective directions.

According to an embodiment of any paragraph(s) of this summary, the different directions are perpendicular to one another.

According to an embodiment of any paragraph(s) of this summary, the connector further includes an electric field generator that provides the electric field to the body.

According to an embodiment of any paragraph(s) of this summary, the electric field generator includes respective electrodes on the parts.

According to an embodiment of any paragraph(s) of this summary, the electrodes are coupled to a potential.

According to an embodiment of any paragraph(s) of this summary, the connector further includes means for providing the electric field to the body.

According to an embodiment of any paragraph(s) of this summary, the connector is a fastener.

According to an embodiment of any paragraph(s) of this summary, the connector is part of a stage separator.

According to an embodiment of any paragraph(s) of this summary, the connector is an electrical or umbilical coupler.

According to another aspect of the invention, a method of physically separating objects includes: applying an electric field to a physical connector that physically couples the objects; wherein the applying the electric field causes piezoelectric forces in the physical connector that break the connector at a boundary between two parts of the connector that have different piezoelectric characteristics.

According to an embodiment of any paragraph(s) of this summary, the applying the electric field includes applying an electric potential to respective electrodes on the parts.

According to yet another aspect of the invention, a method of making a separable physical connector includes: forming a pair of ceramic parts having different piezoelectric characteristics; physically joining the parts; and heating the parts to densify the parts as a single physical object.

According to an embodiment of any paragraph(s) of this summary, the forming the ceramic parts includes forming the parts from respective seed particles having different orientations.

According to an embodiment of any paragraph(s) of this summary, the orientations of the seed particles correspond to directions of piezoelectric expansion of the parts.

According to an embodiment of any paragraph(s) of this summary, the piezoelectric expansion is isotropic in both of the parts.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

DETAILED DESCRIPTION

A coupler for separable physically coupling together a pair of objects includes two parts, on opposite sides of a boundary, that have different piezoelectric characteristics. When an electric field is applied to the coupler parts the piezoelectric forces induce a mechanical stress that separates the parts. The parts may be made of the same or a similar material, such as a suitable ceramic material, with the different piezoelectric characteristics produced by templating the parts with different domain orientations, from different seeds, for example using a three-dimensional manufacturing processes. The coupler may be used to allow shock-free (or reduced shock) separation of parts, such as separation of stages of vehicles such as flight vehicles.

Figure 1:
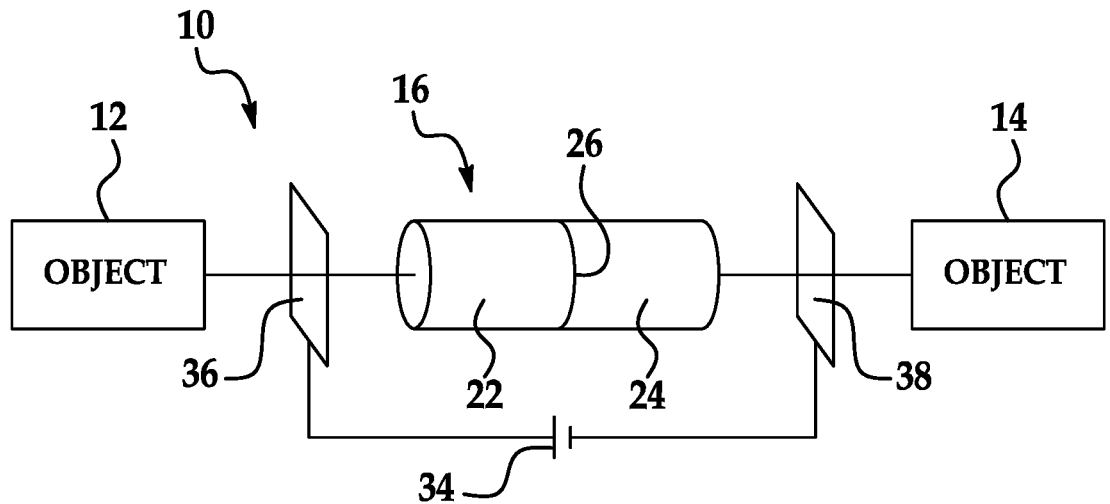
FIG. 1 shows a schematic illustration of a separable physical coupler in accordance with an embodiment of the invention.

FIG. 1 shows a separable physical coupler or separator 10 that is used to separably physically couple together a pair of objects 12 and 14. The physical coupler 10 has a body 16 with a pair of parts 22 and 24, with a boundary 26 between the parts 22 and 24. The first part 22 is physically coupled to the first object 12, and the second part 24 is physically coupled to the second object 14.

The parts 22 and 24 are configured to separate at the boundary 26 when an electric field is applied to the parts 22 and 24. Toward that end an electric field generator 32 is used to apply an electric field to the housing or body 16 when separation between the parts 22 and 24 is desired. The electric field generator 32 includes a potential 34, an energy source such as a battery, and a pair of electrodes 36 and 38. The electrodes 36 and 38 are operatively coupled to the parts 22 and 24 respectively, and may be physically attached to the parts 22 and 24.

The parts 22 and 24 have different characteristics in response to an applied electric field, which produces the separation when the electric field is applied using the electric field generator 32. In one embodiment the parts 22 and 24 have different piezoelectric characteristics. In another embodiment the parts 22 and 24 may have different thermophysical characteristics, such as different coefficients of thermal expansion. In yet another embodiment the parts 22 and 24 have different metaphysical responses to an applied magnetic field. The different piezoelectric characteristics cause the parts 22 and 24 to expand differently in response to the electric field, putting a stress at the boundary 26 that breaks the body 16 at the boundary 26. This separates the parts 22 and 24, breaking the physical connection between the objects 12 and 14.

The different piezoelectric characteristics of the parts 22 and 24 may involve the parts 22 and 24 expanding in different directions in response to the applied electric field. For example the first part 22 may be configured to expand in an axial (longitudinal) direction (the direction from the first part 22 to the second part 24) when subjected to an electric field, and the second part 24 may be configured to expand in a lateral direction that is perpendicular to the axial direction. This is only one possibility for different piezoelectric expansions for the parts 22 and 24. As another example, the parts 22 and 24 may expand in different lateral directions, both perpendicular to the axial direction. Or one of the parts may expand in a radial direction, with the other contracting in a radial direction or expanding in an axial direction.

Figure 2:
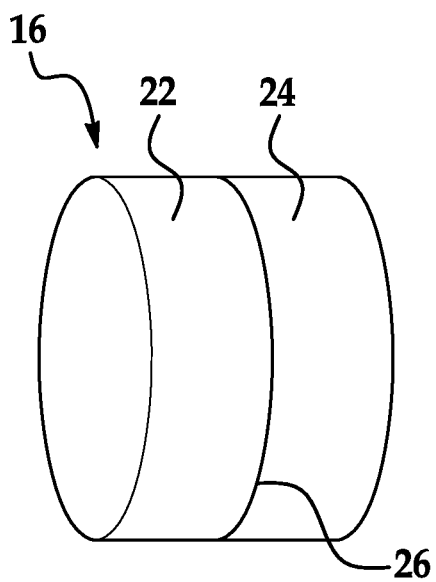
FIG. 2 shows a schematic illustration of a first step of use of the coupler of FIG. 1, prior to the application of an electric field.
Figure 3:
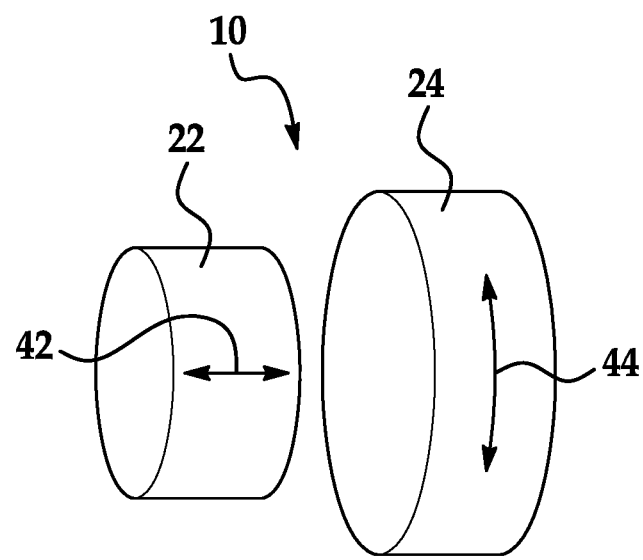
FIG. 3 shows a schematic illustration of a second step of use of the coupler of FIG. 1, with an electric field applied to separate the parts of the coupler.

The separation process is illustrated in FIGS. 2 and 3, with FIG. 2 showing the situation before an electric field is applied, and FIG. 3 showing the separation as the result of applying the electric field, with the first part 22 expanding in a first direction 42 due to piezoelectric effects, and the second part 24 expanding in a second direction 44 due to piezoelectric effects. More broadly any different in piezoelectric characteristics of the parts 22 and 24 may be employed, as long as it is sufficient to create a physical stress that causes separation at the boundary 26.

The parts 22 and 24 may be made of the same material, and except for the different piezoelectric characteristics, may have consistent (constant) properties across the boundary 26. The parts 22 and 24 may be made of the same or similar material, and the parts 22 and 24 may together present the appearance of a single continuous unitary part made of a single material. This acting as a single continuous unitary part may be both in physical appearance, and in terms of physical composition and (most) physical properties. The differences in piezoelectric properties across the boundary 26 may be due to different orientations within the two parts 22 and 24, for example from the parts 22 and 24 being grown or additively manufactured from seeds with different orientation.

For example the parts 22 and 24 may be made of a suitable ceramic material. Different seeds may be used to produce the parts 22 and 24, and then the parts 22 and 24 may be physically joined together while the ceramic material is a green state, that is prior to heating the body 16 to densify the body 16 as a single unitary material object. Alternatively the parts 22 and 24 may be grown from separate seeds in a single process, with the parts 22 and 24 being grown from seeds at opposite ends of the body 16. An example of the growth process is described in co-owned published patent application US 2016/0347667 A1, the drawings and description of which are incorporated herein by reference.

The electrodes 36 and 38 may be placed directly on the respective parts 22 and 24. The electrodes 36 and 38 may be made of any suitable electrically conductive material, such as a suitable metal or alloy. Alternatively the electrodes 36 and 38 may be placed elsewhere, while still being able to apply an electric field across the parts 22 and 24, for instance without physical contact between the electrodes 36 and 38, and the parts 22 and 24.

The power from the potential 34 may be switchable, applied to the electrodes 36 and 38 when decoupling of the parts 22 and 24 is desired. This may be controlled by a suitable controller (not shown) such as (or including) a computer or integrated circuit, which may rely on any of a variety of data and/or inputs to trigger decoupling (separation) of the parts 22 and 24.

The coupler 10 may be any of a variety of objects or devices, for separably physically coupling together any of a variety of objects. The coupler 10 may be used in the separation of entire structures, such as stages of a rocket or other flight vehicle or the nose cone of a vehicle, or in smaller parts, such as in the separation of connectors when larger parts are separated. The coupler 10 may be separate item, or may be integrated into a larger structure, such as being integrated as part of fuselage sections of stages of a rocket or other flight vehicle. As another alternative, the coupler 10 may be a fastener, such as a bolt or rivet, that holds a pair of objects or parts of objects together, with separation of the fastener resulting in physical decoupling or separation of the objects.

The boundary 26 may be a flat surface between the parts 22 and 24. Alternatively the boundary 26 may have a surface that is other than flat, for example having ridges or other texture and/or protrusions/recesses.

What follows now is a description of how the parts 22 and 24 may be formed from seed crystals. The description should be considering nonlimiting examples for such formation. Further details and examples, in addition to the following, may be found in co-owned published patent application US 2016/0347667 A1.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the terms "percent by weight," "% by weight," and "wt. %" mean the weight of a pure substance divided by the total dry weight of a compound or composition, multiplied by 100.

As used herein, the term "ceramic filament" means a structure comprising a ceramic material and having been extruded with to a length of at least 10 centimeters (cm).

As used herein, the term "additive" means any chemical, compound, particle, nanoparticle, nanotube, polymer, seed crystal, material, or mixture thereof, which is in the form of a structure having an aspect ratio of at least 2:1.

As used herein, the term "aspect ratio" when used reference to an additive means the ratio of length to diameter. The aspect ratio is expressed as two numbers separated by a colon (e.g., x:y), which represent the relationship between length and diameter.

As used herein, the term "seed crystal" means a chemical, material, or compound with a monocrystalline structure suitable for templating grain growth with a lattice mismatch to the host material of no greater than 5%. In one aspect, the lattice mismatch to the host material is no greater than 2%.

As used herein, the terms "monocrystalline" or "single crystal" mean the material's crystal lattice is continuous to its edges. As used herein, the term "polycrystalline" means the material's crystal lattice is not continuous to its edges. Polycrystalline materials can include discrete crystalline areas. Whether a material is monocrystalline or polycrystalline is determined by x-ray diffraction or transmission electron microscopy (TEM). A monocrystalline material would only exhibit specific crystallographic orientation patterns while a polycrystalline material would exhibit all crystallographic orientations.

As used herein, the term "textured" means a polycrystalline material having a monocrystalline structure (or single crystal structure) in which all of the discrete crystalline areas exhibit the same or substantially the same crystallographic orientation.

Textured ceramic materials can provide uniquely tailored properties, which depend on the orientation of template additives. Using additives in the ceramics with aspect ratios of at least 2:1 to form filaments and then 3D printing by fused/filament deposition modeling (FDM) enables ceramic with textured microstructures and surfaces, as well as enhanced physical and chemical properties that do not exist in nature.

Ceramic processing and extrusion may be used to prepare highly loaded ceramic filaments. Various additives are used in a ceramic matrix to form filaments for 3D printing by FDM. Depending on the type of additive, the ceramic filaments can form textured ceramic articles (e.g., using seed particles) or articles with any desired functionality (e.g., using dopants, fibers, carbon nanotubes, and the like).

Seed particles, within a ceramic matrix, are oriented by shear stress during ceramic filament extruding. The extruded filaments are fed into a 3D printer, and through FDM, the seed particles retain orientation dictated by the printing direction. During subsequent thermal processing, the polymer binders present in the composition are removed, and the ceramic article is densified. In this process, the template seeds are grown to produce a ceramic with a dense, textured ceramic with an engineered microstructure.

As described above, non-cubic materials that exhibit anisotropic properties based on their crystallographic orientation are textured by the addition of seed particles or crystals. The ceramic can be printed in desired orientations to form a ceramic article with texture in all three dimensions.

Materials with properties that do not exist in nature can be synthesized, capitalizing on the anisotropic properties of the ceramic. These methods may provide single crystal-like (monocrystalline) properties, even though they are polycrystalline, in a sintered ceramic at a fraction of the cost of single crystals, as well as textured properties in orientations not feasible by any other process.

When other additives are used, for example, needles, and fibers having aspect ratios of at least 2:1, ceramic materials and articles with any desired physical properties can be achieved. For example, needles provide improved piezoelectric responses.

During ceramic compounding, a ceramic powder may be combined with a binder system. The ceramic powder is mixed with a dispersant in a suitable solvent to coat the ceramic powder. The solvent depends on the ceramic powder and dispersant used.

The ceramic powder may include ceramic nanoparticles, ceramic nanograins, or ceramic composites, and is not intended to be limited. The ceramic powder can be, but is not limited to, carbon, magnesium oxide, yttrium oxide, aluminum oxide, silicon carbide, aluminum nitride, silicon nitride, zirconia, or any combination thereof. The ceramic powder can be any metal oxide, metal nitride, metal carbide, metal sulfide, metal selenide, or any combination thereof.

The dispersant can be a steric dispersant, an electrosteric dispersant, or an ionic dispersant. The ionic dispersant can be an acidic dispersant or a basic dispersant. The basic dispersant can be, but it not limited to, an organic base having about 6 to 28 carbon atoms and an amine head group such as, for example, caprylamine, laurylamine, stearylamine, or oleylamine. The acidic dispersant may be a fatty acid having about 6 to 28 carbon atoms and a carboxyl head group, such as, for example, capric acid, lauric acid, palmitic acid, stearic acid, myristoleic acid, palmitoleic acid, oleic acid, stearidonic acid, or linolenic acid. The dispersant can be stearic acid.

After coating the ceramic powder, the coated ceramic powder is compounded by combining with an additive and a binder. Then the mixture is blended using a high shear mixer to form a ceramic feedstock.

The binder can be any suitable ceramic binder and is not intended to be limited. Any suitable binder material (e.g., thermoplastic polymers) may be used. Binder materials are selected based on their compatibility with the ceramic powder material. Non-limiting examples of binders include base binders (e.g., amorphous polyalphaolefins), tackifiers (e.g., aliphatic/aromatic hydrocarbon resins), waxes (e.g., polyethylene waxes), plasticizers (e.g., polybutene, isobutylene/butane copolymers), or any combination thereof.

The binder is added in an amount depending on the type of ceramic. In one aspect, the binder is added to the ceramic composition (including the ceramic powder, dispersant, additive, and binder in solvent) in an amount in a range between about 45 to 50 volume % (vol. %). In another aspect, the binder is added in an amount in a range between about 40 and 60 vol. %. Yet, in another aspect, the binder is added in an amount about or in any range between about 40, 45, 50, 55, and 60 vol. %.

The additive can be any chemical, compound, or material, or combination thereof which is formed into a shape having an aspect ratio of at least 2:1. In one embodiment, the aspect ratio is between about 5:1 and 20:1. In another aspect, the aspect ratio is between about 5:1 and 30:1. Yet, in another aspect, the aspect ratio is about or in any range between about 3:1, 4:1, 5:1, 6:1, 7:1, 8:1, 9:1, 10:1, 11:1, 12:1, 13:1, 14:1, 15:1, 16:1, 17:1, 18:1, 19:1, 20:1, 25:1, 30:1, 35:1, 40:1, 45:1, and 50:1.

The additive is added to the ceramic composition in an amount of at least 2 wt. % based on the total weight of the ceramic in the composition. In one aspect, the additive is present in an amount in a range between about 2 and about 4 wt. % based on the total weight of the ceramic in the composition. Yet, in another aspect, the additive is present in an amount of about or in any range between about 1, 2, 3, 4, 5, 6, 7, 8, 9, and 10 wt. %.

Non-limiting examples of suitable additives include a seed particle or crystal (including a crystalline material), a dopant, a fiber, a whisker, a needle, a carbon nanotube, or any combination thereof. The additive can include any crystalline material, synthetic material, or polymeric material. Non-limiting examples of suitable additives include leucite, lithium disilicate, silicon nitride, glass (e.g., silica), or any combination thereof.

Non-limiting examples of crystalline materials include YAG (yttrium aluminum garnet), YLF (yttrium lithium fluoride), sapphire (aluminum oxide), LiSAF (lithium strontium aluminum fluoride), yttrium oxide, cubic oxides, and combinations thereof.

Suitable dopants include rare earth elements and liquid phase formers. Non-limiting examples of dopants include chromium ions, neodymium ions, erbium ions, ytterbium ions, titanium ions, or any combination thereof. Liquid phase formers will form a liquid phase at elevated temperatures, which allow for increased diffusion rates that facilitate more rapid texture development.

After the compounding, the feedstock may be screw-extruded through an orifice having any suitable diameter. The filament diameter can be tailored as desired and is not intended to be limited. The filament diameter can be, for example, between about 1 and 10 millimeters (mm). Then the extruded filaments are 3D printed via fused deposition modeling (FDM).

The additives become aligned or oriented within the filaments. In one embodiment, at least 50% of the additive is aligned with respect to the extrusion direction and with less than 30° misorientation. Alignment with respect to the extrusion direction means that the additive is oriented in the same direction or in the axis of the extrusion direction, within +/−30°.

In other embodiments, at least 60, 70, 80, 90, 92, 95, 97, 99, or 100% of the additive is aligned with respect to the extrusion direction, and with less than 30°, 20°, or 10° misorientation.

Additive alignment can be measured by analysis of cross-sectional micrographs. Image analysis software can ascertain the identity of the additives and the alignment with respect to a known axis provided there is a distinguishable contrast difference.

The filaments are then spooled for use in an FDM 3D printing machine. Computer aided design files and slicing models are modified to print the 3D ceramic articles in the desired print pattern, as opposed to pre-determined optimal printing patterns generated by 3D printing software.

The 3D printing using FDM may be accomplished using a commercially available system from Stratasys, Inc., of Eden Prairie, Minn., USA. The additive infused ceramic filaments are unwound and supplied to an extrusion nozzle that can turn the flow on and off. The extrusion nozzle is heated to melt the material in the filaments. Both the extrusion nozzle and a base or bed are controlled by a computer that translates the dimensions of an object into x, y, and z coordinates for the extrusion nozzle and base to follow during printing. The extrusion nozzle can be moved in both horizontal and vertical directions by a numerically controlled mechanism. The extrusion nozzle follows a path controlled by a computer-aided manufacturing (CAM) software package, and the ceramic part or article is built from the bottom up, one successive layer at a time. The ceramic material extruded is initially in an elongated tubular form, which is successively layered to form a ceramic article in the green state.

The green state ceramic is then densified to form a final finished ceramic article. Densification renders the green state ceramic to its denser and stronger finished state. Densification also reduces porosity of a green state ceramic, thereby increasing density. Physical properties (e.g., mechanical strength, electrical properties, etc.) may benefit from a high relative density. Densification includes removing the binder, sintering, hot pressing, hot isostatic pressing (HIP), or any combination thereof.

The binder may be removed by heating the green ceramic to substantially burnout or vaporize the binder. The temperatures used for removing the binder may be between 200 and 600° C. Any suitable furnace or oven may be used to heat the green state ceramic. The binder also may be removed through solvent extraction. Removing the binder is advantageous because binder residues may interfere with the process of eliminating porosity during densification.

After removing the binder, the ceramic article is sintered. Sintering includes heating the material to between 1,000 and 2,000° C., depending on the materials. Sintering is performed using a vacuum furnace, a high temperature furnace, a high temperature controlled atmospheric furnace (e.g., pure oxygen, helium, helium oxygen gas mixtures), a hot press, or a hot isostatic press (HIP) or any other suitable solid state sintering method. The same furnace used for removing the binder may be used for sintering.

During sintering, the powders that are used to manufacture the green state ceramic are densified and transformed to a strong, dense ceramic body upon heating. Sintering may reduce porosity within a green state ceramic and enhance properties, such as strength. During the sintering firing process, particles diffuse together, forming larger grains such that the porosity may be substantially eliminated. Accordingly, the grain size of the particles may become larger than the starting grain size. Sintering may result in full densification of the green state ceramic.

After sintering, optionally, HIP may be used. HIP can further reduce or eliminate any residual porosity that may remain. The sintered ceramic is subjected to elevated temperature and an isostatic pressure in a high pressure containment vessel. Equal amounts of pressure (isostatic) are applied to the ceramic from all directions. A pressurizing inert gas (e.g., argon) may be used. At elevated temperatures and pressures, the argon gas liquefies, and the liquid at high pressure exerts the isostatic pressure on the ceramic article. A gas pumping system can be used to achieve pressure level. HIP reduces porosity and increases the density of the ceramic material. HIP may also improve mechanical properties.

The 3D printing of ceramic articles with additives as described above provides several advantages. These methods can be used to make ceramics with complex geometries and internal features that are not achievable with binder jetting methods. Further, higher resolution and sintered density is achievable compared to robocasting. Additionally, textured ceramics with monocrystalline properties, which was previously very expensive, can be made for a fraction of the cost.

Figure 4:
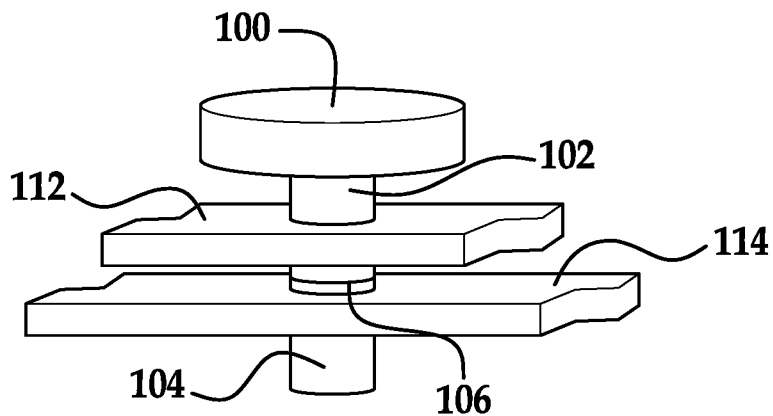
FIG. 4 shows an embodiment of the coupler, used as a fastener.

What follows now are several examples of possible configurations of separable physical couplers or separators, and devices incorporating or using such couplers or separators. FIG. 4 shows a fastener 100 that has a pair of parts 102 and 104 that separate along a separation line (or boundary) 106 when subjected to an electric field (such as to electrodes (not shown)), due to different piezoelectric response of the parts 102 and 104. This allows separation of the objects 112 and 114, for example flight vehicle stages, that are held together by the fastener 100. The fastener 100 may be one of a series of fasteners that separably hold together a pair of objects.

Figure 5:
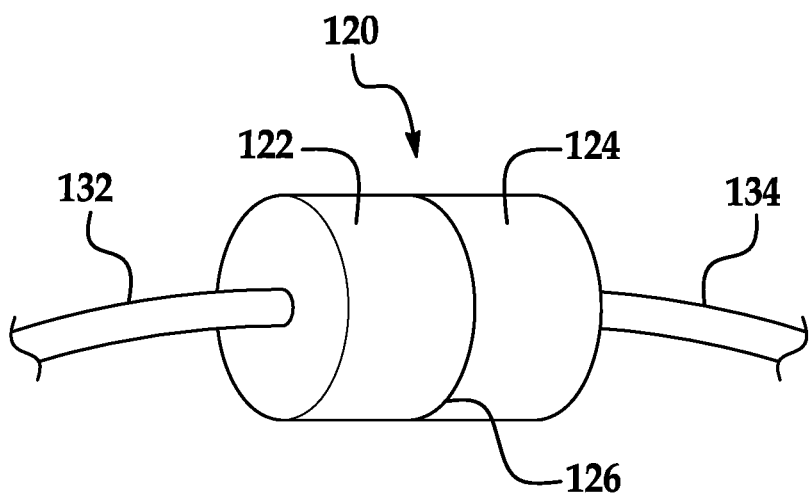
FIG. 5 shows an embodiment of the coupler, used as part of an electrical connection or umbilical line.

FIG. 5 shows an electrical connection or coupler 120 that has a pair of parts 122 and 124 that separate along a boundary 126 when subjected to an electric field, due to different piezoelectric effects in the parts 122 and 124. The connection 120 allows severing of a connection between electrical lines 132 and 134. The connection 120 may be used to separably an electrical umbilical line between a launcher and a launched vehicle or object, for example. A similar coupler may be sued to sever other sorts of connected lines.

Figure 6:
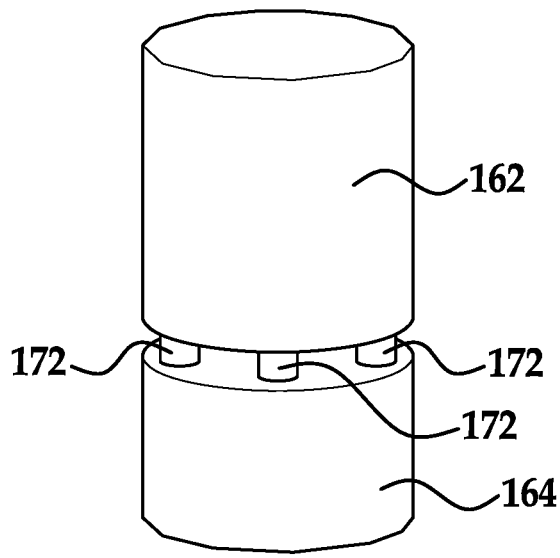
FIG. 6 shows an embodiment of the couplers, used as a stage separator.

FIG. 6 illustrates separation of a pair of stages 162 and 164 of a flight vehicle 160, using a series of separable couplers 172 at locations around the flight vehicle 160. The couplers 172 have parts with different piezoelectric characteristics, as described above, that allows physical separation by application of an electric field.

Devices such as those described above may be used in any of a variety of situations where graceful failure of a joint is desired. Couplers are only one example of such an application.

Physical couplers such as described above may be used in a variety of other suitable situations. The couplers may have any of a range of suitable sizes, for example from on the order of millimeters to on the order of meters. Limitations on size may be (on the small end) the ability to generate sufficient forces for fracture to (on the large end) the size of furnaces and/or other fabricating facilities. The couplers may have any of a wide variety of shapes and/or configurations.

Couplers such as described herein may have many advantages relative to prior separation mechanisms. For example they may allow separation without the use of explosives, which may require special handling. The separation may be made without complicated and expensive mechanical couplings that require multiple parts. The separation may be made gently, without sudden shocks or other forces, such as occur when explosives are detonated. Prior to separation the coupler may be structurally robust, as well as providing uniform physical properties through the coupler. Further, the separation mechanism of applying an electrical field may be easy to initiate, while not being evident from a visual inspection of the coupler.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A separable physical connector comprising:
    a body;
    wherein the body has a pair of parts with different piezoelectric characteristics, with a boundary between the parts; and
    wherein when an electric field is applied across the body the parts separate from one another at the boundary due to the action of piezoelectric forces generated by the electric field.

2. The connector of claim 1, wherein the parts both have the same material composition.

3. The connector of claim 1, wherein the parts are both made of a ceramic material.

4. The connector of claim 1, wherein the parts of parts of a single unitary continuous piece of material.

5. The connector of claim 1, wherein at least one of the parts has an isotropic piezoelectric characteristic.

6. The connector of claim 1, wherein the parts have different isotropic piezoelectric characteristics in different respective directions.

7. The connector of claim 6, wherein the different directions are perpendicular to one another.

8. The connector of claim 1, further comprising an electric field generator that provides the electric field to the body.

9. The connector of claim 8, wherein the electric field generator includes respective electrodes on the parts.

10. The connector of claim 9, wherein the electrodes are coupled to a potential.

11. The connector of claim 1, further comprising means for providing the electric field to the body.

12. The connector of claim 1, wherein the connector is a fastener.

13. The connector of claim 1, wherein the connector is part of a stage separator.

14. The connector of claim 1, wherein the connector is an electrical or umbilical coupler.

15. A method of physically separating objects, the method comprising:
    applying an electric field to a physical connector that physically couples the objects;
    wherein the applying the electric field causes piezoelectric forces in the physical connector that break the connector at a boundary between two parts of the connector that have different piezoelectric characteristics.

16. The method of claim 15, wherein the applying the electric field includes applying an electric potential to respective electrodes on the parts.

\* \* \* \* \*